(12) United States Patent
Han

(10) Patent No.: US 10,613,401 B2
(45) Date of Patent: Apr. 7, 2020

(54) ARRAY SUBSTRATE AND METHOD FOR REPAIRING BROKEN LINES THEREOF, DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventor: Lei Han, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 16/135,966

(22) Filed: Sep. 19, 2018

(65) Prior Publication Data
US 2019/0086750 A1 Mar. 21, 2019

(30) Foreign Application Priority Data

Sep. 21, 2017 (CN) .......................... 2017 1 0861463

(51) Int. Cl.
*G02F 1/1362* (2006.01)
*H01L 27/12* (2006.01)
(52) U.S. Cl.
CPC .. *G02F 1/136259* (2013.01); *G02F 1/136286* (2013.01); *H01L 27/124* (2013.01);
(Continued)
(58) Field of Classification Search
CPC .............................................. G02F 1/136259
See application file for complete search history.

(56) References Cited

U.S. PATENT DOCUMENTS

2009/0268119 A1* 10/2009 Lee ................... G02F 1/136259
349/54
2013/0155342 A1* 6/2013 Wu ................... G02F 1/136259
349/43
(Continued)

FOREIGN PATENT DOCUMENTS

CN 1987622 A 6/2007
CN 101566770 A 10/2009
(Continued)

OTHER PUBLICATIONS

First Office Action issued in corresponding Chinese Application No. 201710861463.0, dated Sep. 29, 2019, with English translation.

*Primary Examiner* — Edmond C Lau
(74) *Attorney, Agent, or Firm* — McDermott Will & Emery LLP

(57) ABSTRACT

The present disclosure provides an array substrate and a method for repairing broken lines thereof, and a display device. The array substrate includes: a base substrate; a plurality of gate lines and a plurality of data lines located on the base substrate, the plurality of gate lines intersecting with the plurality of data lines to define a plurality of pixel units arranged in an array; a thin film transistor and a pixel electrode located in each pixel unit; a plurality of extension sections connected to at least one of the gate lines; the pixel electrodes being in one-to-one correspondence with the plurality of extension sections, and an orthographic projection of each of the plurality of extension sections on the base substrate at least partially overlapping an orthographic projection of a corresponding pixel electrode on the base substrate.

18 Claims, 6 Drawing Sheets

(52) U.S. Cl.
CPC ............ *G02F 2001/136263* (2013.01); *G02F 2201/123* (2013.01)

(56) References Cited

U.S. PATENT DOCUMENTS

2015/0185513 A1* 7/2015 Wu .................. G02F 1/134363
 257/72
2018/0108676 A1 4/2018 Cheng et al.

FOREIGN PATENT DOCUMENTS

| CN | 103278987 A | 9/2013 |
| --- | --- | --- |
| CN | 205427404 U | 8/2016 |
| CN | 107065343 A | 8/2017 |

\* cited by examiner

ARRAY SUBSTRATE AND METHOD FOR REPAIRING BROKEN LINES THEREOF, DISPLAY DEVICE

CROSS-REFERENCE TO RELATED APPLICATION

This application claims priority to Chinese Patent Application No. 201710861463.0, filed on Sep. 21, 2017, titled "ARRAY SUBSTRATE AND METHOD FOR REPAIRING BROKEN LINES THEREOF, DISPLAY DEVICE", which is incorporated herein by reference in its entirety.

TECHNICAL FIELD

The present disclosure relates to the technical field of display technologies, more particularly, to an array substrate and a method for repairing broken lines thereof, and a display device.

BACKGROUND

An array substrate is one of core components in a liquid crystal display panel, and the array substrate comprises: a plurality of data lines and a plurality of gate lines. A mother board of liquid crystal display panel which is large-sized is formed by ceiling a mother board of array substrate having a plurality of array substrates and a mother board of color filter substrate having a plurality of color filter substrates (or a mother board of array substrate and a mother board of cover plate). A cutting process on the mother board of liquid crystal display panel is preformed to form single panels which are applied to various display products. After the cutting process, it is necessary to perform a cell test on each of the single panels to determine the quality thereof.

Since signal lines (such as the data lines and the gate lines) are prone to break during the preparation process of the liquid crystal display panel, and the data lines and the gate lines cannot normally transmit signals after they are broken, the conformity rate of the liquid crystal display panel is reduced. Under this circumstance, it is necessary to detect and repair the broken lines of the signal lines on the array substrate in the liquid crystal display panel to improve the conformity rate thereof.

SUMMARY

In one aspect, some embodiments of the present disclosure provide an array substrate, comprising:

a base substrate;

a plurality of gate lines and a plurality of data lines located on the base substrate, a plurality of gate lines intersecting with the plurality of data lines to define a plurality of pixel units arranged in an array, each row of pixel units being located between two adjacent gate lines;

a thin film transistor (TFT) and a pixel electrode located in each of pixel units; a source electrode of the TFT being connected to one of the plurality of data lines, and a drain electrode of the TFT being electrically connected to the pixel electrode; a gate electrode of the TFT in each row of the pixel units being connected to one of the plurality of gate lines;

a plurality of extension sections connected to at least one of the gate lines;

wherein a plurality of pixel electrodes are in one-to-one correspondence with the plurality of extension sections, and an orthographic projection of each of the plurality of extension sections on the base substrate at least partially overlaps an orthographic projection of a corresponding pixel electrode on the base substrate.

Alternatively, a hollowed-out region is provided in an intersecting region formed by intersecting each of the plurality of gate lines with each of the plurality of data lines; the hollowed-out region has spacing distances with both side edges of the gate line along its length direction.

Alternatively, the plurality of gate lines are disposed closer to the base substrate than the plurality of data lines.

In another aspect, some embodiments of the present disclosure provide a method for repairing broken lines of the array substrate, comprising:

determining a broken-line position where a data line is broken;

determining a first pixel unit that fails to receive a data line signal according to the line-broken position;

letting a pixel electrode in the first pixel unit bypass the line-broken position, comprising:

electrically connecting a front end of the line-broken position to the pixel electrode in the first pixel unit via the extension section in the first pixel unit and a separation section connected with the extension section and electrically separated from the repairing gate line; electrically connecting a back end of the line-broken position to the pixel electrode in the first pixel unit via the gate electrode of the TFT in the first pixel unit that is electrically separated from a lower gate line adjacent to the repairing gate line;

wherein a direction from the front end to the back end is a transmission direction of the data line signal.

Alternatively, the step of electrically connecting the front end of the line-broken position to the pixel electrode in the first pixel unit comprises:

cutting the repairing gate line in a region adjacent to the first pixel unit to form a separation section electrically separated from the repairing gate line, the separation section being connected to the extension section in the first pixel unit;

fusing the separation section with the front end of the line-broken position;

fusing the extension section in the first pixel unit with the pixel electrode in the first pixel unit.

Alternatively, the step of electrically connecting the back end of the line-broken position to the pixel electrode of the first pixel unit comprises:

cutting the gate electrode of the TFT in the first pixel unit to electrically separate the cut gate electrode from a gate line corresponding to the first pixel unit;

fusing the gate electrode of the TFT in the first pixel unit with the source electrode thereof, wherein the source electrode is electrically connected to the back end of the line-broken position;

fusing the gate electrode of the TFT in the first pixel unit with the drain electrode thereof, wherein the drain electrode is electrically connected to the pixel electrode in the first pixel unit.

Alternatively, the step of fusing the separation section with the front end of the line-broken position comprises:

fusing the separation section with the front end of the line-broken position at a region where the repairing gate line intersects with the broken data line.

Alternatively, a hollowed-out region is provided in an intersecting region formed by intersecting each of the plurality of gate lines with each of the plurality of data lines, and the hollowed-out region has spacing distances with both side edges of the gate line along its length direction;

determining that a hollowed-out region at a region where the repairing gate line intersects with the broken data line is a first hollowed-out region, and a next hollowed-out region along the length direction of the repairing gate line and immediately adjacent to the first hollowed-out region is a second hollowed-out region;

cutting the repairing gate line in a region adjacent to the first pixel unit, and the cutting path passing through the first hollowed-out region and the second hollowed-out region, and forming a separation section electrically separated from the repairing gate line by virtue of the first hollowed-out region and the second hollowed-out region.

Alternatively, the step of cutting the repairing gate line in a region adjacent to the first pixel unit comprises:

cutting the repairing gate line in a width direction, a length direction, and then a width direction sequentially.

Alternatively, the cutting is a cutting using a laser; and/or, the fusing is a fusing using a laser.

In a further aspect, some embodiments of the present disclosure provide a method for repairing broken lines of the array substrate, comprising:

determining a line-broken position where a gate line is broken;

determining a last pixel unit that can receive a gate line signal according to the line-broken position, and a next pixel unit immediately adjacent to the last pixel unit;

letting a pixel electrode in the last pixel unit and a pixel electrode in an immediately adjacent next pixel unit bypass the line-broken position, comprising:

electrically connecting a front end of the line-broken position to the pixel electrode in the last pixel unit via the gate electrode of the TFT in the last pixel unit;

electrically connecting a back end of the line-broken position to the pixel electrode in the immediately adjacent next pixel unit via the gate electrode of the TFT in the immediately adjacent next pixel unit;

electrically connecting the pixel electrode in the last pixel unit to the pixel electrode in the immediately adjacent next pixel unit via an extension section in the last pixel unit, an extension section in the immediately adjacent next pixel unit, and a separation section connecting the two extension sections and electrically separated from the repairing gate line;

wherein a direction from the front end to the back end is a transmission direction of the gate line signal.

Alternatively, the step of electrically connecting the front end of the line-broken position to the pixel electrode in the last pixel unit comprises:

cutting the source electrode of the TFT in the last pixel unit, such that the cut source electrode is electrically separated from a data line corresponding to the last pixel unit;

fusing the gate electrode of the TFT in the last pixel unit with the drain electrode thereof, wherein the gate electrode is electrically connected to the front end of the line-broken position, and the drain electrode is electrically connected to the pixel electrode in the last pixel unit;

the step of electrically connecting the back end of the line-broken position to the pixel electrode in the immediately adjacent next pixel unit comprises:

cutting the source electrode of the TFT in the immediately adjacent next pixel unit to electrically separate the cut source electrode from a data line corresponding to the immediately adjacent next pixel unit;

fusing the gate electrode of the TFT in the immediately adjacent next pixel unit with the drain electrode thereof, wherein the gate electrode is electrically connected to the back end of the line-broken position, and the drain electrode is electrically connected to the pixel electrode in the immediately adjacent next pixel unit.

alternatively, the step of electrically connecting the pixel electrode in the last pixel unit to the pixel electrode in the immediately adjacent next pixel unit comprises:

cutting a repairing gate line in a region adjacent to the last pixel unit and the immediately adjacent next pixel unit to form a separation section electrically separated from the repairing gate line, and the separation section being connected to extension sections in the last pixel unit and the immediately adjacent next pixel unit;

fusing an extension section of the last pixel unit with a pixel electrode of the last pixel unit;

fusing an extension section of the immediately adjacent next pixel unit with a pixel electrode of the immediately adjacent next pixel unit.

Alternatively, a hollowed-out region is provided in an intersecting region formed by intersecting each of the plurality of gate lines with each of the plurality of data lines; wherein the hollowed-out region has spacing distances with both side edges of the gate line along its length direction;

determining that the hollowed-out region at a region where the repairing gate line intersects with the data line corresponding to the last pixel unit is a third hollowed-out region, and next two hollowed-out regions along the length direction of the repairing gate line and immediately adjacent to the third hollowed-out region are sequentially a fourth hollowed-out region and fifth hollowed-out region;

cutting the repairing gate line in a region adjacent to the last pixel unit and the immediately adjacent next pixel unit, and the cutting path passing through the third hollowed-out region, the fourth hollowed-out region and the fifth hollowed-out region, and forming a separation section electrically separated from the repairing gate line by virtue of the third hollowed-out region, the fourth hollowed-out region and the fifth hollowed-out region.

Alternatively, the step of cutting the repairing gate line in a region adjacent to the last pixel unit and the immediately adjacent next pixel unit comprises:

cutting the repairing gate line in a width direction, a length direction, and then a width direction sequentially.

Alternatively, the cutting is a cutting using a laser; and/or, the fusing is a fusing using a laser.

In yet another aspect, some embodiments of the present disclosure further provide a display device, comprising the above-mentioned array substrate, an opposite substrate which is celled with the array substrate, and a liquid crystal layer located between the array substrate and the opposite substrate.

BRIEF DESCRIPTION OF THE DRAWINGS

In order to describe technical solutions in embodiments of the present disclosure more clearly, the accompanying drawings to be used in the description of embodiments will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

Figure 1:
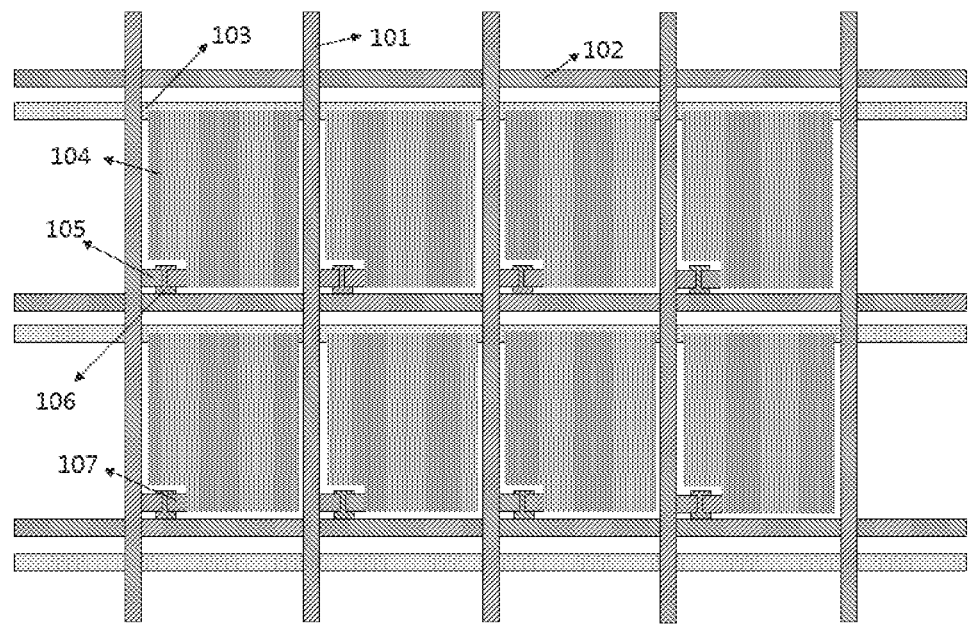
FIG. 1 is a partial structural diagram of an array substrate having a design of Cs on Common provided in an exemplary embodiment of the present invention.

The technical solutions in the embodiments of the present disclosure will be described clearly and completely with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

It should be noted that unless otherwise defined, all terminologies (including technical and scientific terminologies) used in the embodiments of the present disclosure have the same meaning as commonly understood by a person with ordinary skill in the art. It should also be understood that, terminologies such as those defined in ordinary dictionaries should be interpreted as having meanings consistent with their meanings in the context of the related art, instead of being explained in an idealized or extremely formalized sense unless explicitly defined as such herein.

For example, as used in this specification and the claims, the terminologies "first," "second," and similar terms do not denote any sequence, quantity, or importance, but are used to distinguish different constituent parts. The words "including" or "comprising", and the like, are intended to mean that the elements or articles that appear in front of the word contain the listed elements or articles that appear after this word and the equivalents thereof, while not excluding other elements or articles. The orientation or positional relationship of the terminologies "on/upper", "under/lower", "row/row direction", and "column/column direction" is based on the orientation or the positional relationship shown in the drawings, and these terminologies are only for the purpose of illustrating the simplified description of the technical solutions of the present disclosure, but are not intended to indicate or imply that the device or element that is referred to must have a particular orientation, or be configured or operated in a particular orientation, thus these terminologies are not to be understood as limiting the present disclosure. For example, in some cases, embodiments involving "row direction" can be implemented in a "column direction", and vice versa. It is still within the scope of the patent right of the present disclosure after performing a 90° rotation or mirror image of the solution in this patent.

As shown in FIG. 1, an exemplary embodiment of the present disclosure provides an array substrate, and the array substrate includes: a plurality of data lines 101 and a plurality of gate lines 102, which are cross set to define a plurality of pixel units therebetween; a pixel electrode 104 located in each pixel unit and a TFT in electrical connection with a data line 101 corresponding to a pixel unit and a gate line 102 corresponding to the pixel unit; wherein a source electrode 105 of each TFT is electrically connected to a data line 101, a drain electrode 107 of each TFT is electrically connected to a pixel electrode 104, and a gate electrode 106 of each TFT is electrically connected to a gate line 102.

Each of the gate lines 102 provides a scanning signal to the TFT connected thereto, and each of the gate lines 101 provides a data signal to the TFT connected thereto, so as to control the display panel to display picture.

The array substrate further includes a plurality of common electrode lines 103 disposed in parallel with the plurality of gate lines 102. Each of the common electrode lines 103 is adjacent to its corresponding gate line 102. There is an overlapping region between each of the pixel electrodes 104 and the common electrode line 103 on the same side (both are located on the same side of the gate line 102 in electrical connection with each of the pixel electrodes 104). The overlapping region between each of the pixel electrodes 104 and the common electrode line 103 together with the insulating medium therebetween constitute a storage capacitor (Cs) to maintain normal charging and discharging of the pixel electrode before the next scan.

This design of the storage capacitor is called as Cs on Common, that is, the storage capacitor is designed on the common electrode line.

In the above design, since an additional common electrode line is added to each row of pixel units, the effective area of the pixel region (the area of the region used for displaying a picture) in the array substrate is reduced, resulting in a decrease in the aperture ratio of the display panel.

In order to increase the aperture ratio of the display panel, the exemplary embodiment of the present disclosure provides another array substrate, which is as follows:

removing the plurality of common electrode lines in the array substrate to increase the effective area of the pixel region; at the same time, in order not to affect the normal charging and discharging of each pixel electrode by the storage capacitor, an overlapping region is designed between each gate line and its corresponding pixel electrode, that is, the overlapping region between a gate line and its corresponding pixel electrode together with the insulating medium therebetween constitute a storage capacitor (Cs). This design of the storage capacitor is called as Cs on Gate, that is, the storage capacitor is designed on the gate line.

For an array substrate of which the design of the storage capacitor is Cs on Gate, a broken line, such as a data line, can only be repaired by peripheral repair lines placed outside the effective display area (one pixel unit corresponds to one pixel region, and the effective display area includes a plurality of pixel regions) since there is no common electrode line, when it is found in a lighting detection which is executed on each unit area of the display panel after being celled that the display panel has the broken line such as the data line.

This repairing method mainly has the following problems:

Firstly, the repairing quantity is limited: since the space and area outside the effective display area in the array substrate is limited, the number of repairing lines that can be designed outside the effective display area is limited, generally only two or so. As a result, the number of broken data lines that can be repaired is limited, and thus repairing of data lines is limited by the number of repairing lines;

Secondly, only one type of broken lines can be repaired: only broken data lines can be repaired due to being limited by the current design of peripheral repair lines, and gate lines cannot be repaired;

Thirdly, there is a signal delay phenomenon: the transmission path of the electrical signal is too long when a peripheral repairing line is used for repair, resulting in inconsistent signals at both ends of the broken line.

Figure 2:
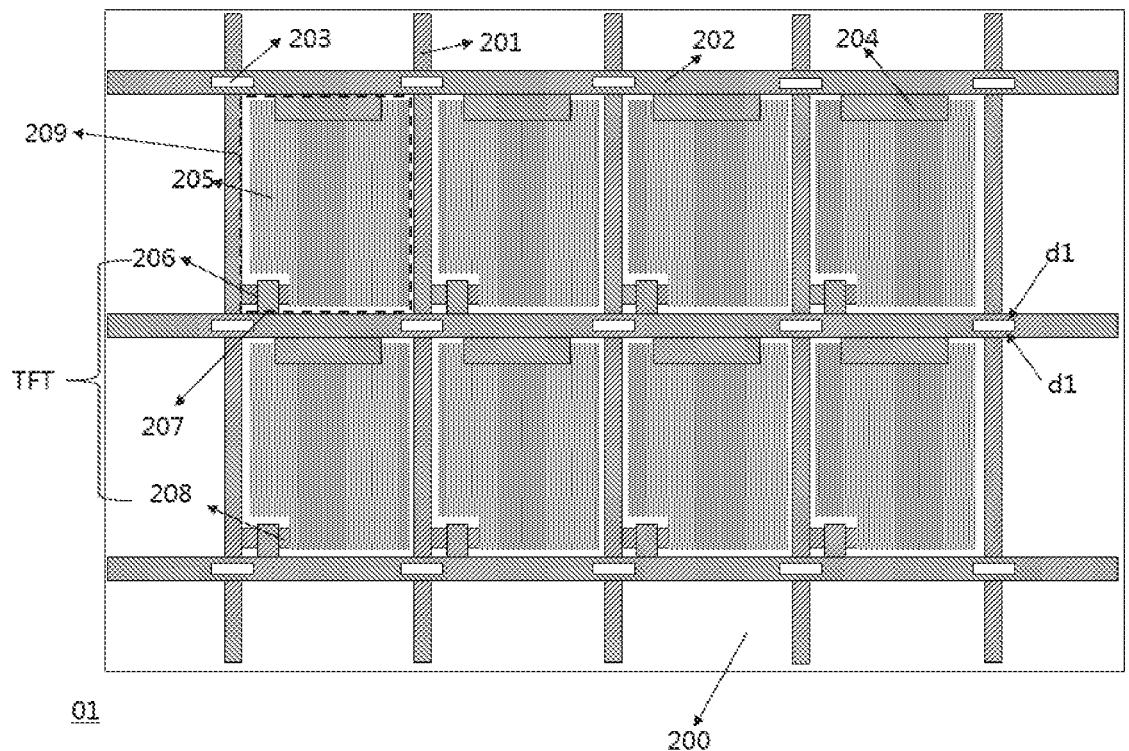
FIG. 2 is a partial structural diagram of an array substrate which is seen from a side of a base substrate provided in some embodiments of the present disclosure.

Based on this, as shown in FIG. 2, some embodiments of the present disclosure provide an array substrate 01, including:

a base substrate 200;

a plurality of gate lines 202 and a plurality of data lines 201 located on the base substrate 200, and the plurality of gate lines 202 intersecting with the plurality of data lines 201 to define a plurality of pixel units 209 (as shown by dotted line in FIG. 2) arranged in an array; each row of pixel units 209 being located between two adjacent gate lines 202;

a thin-film transistor (TFT) and a pixel electrode 205 located in each pixel unit 209; a source electrode 206 of the TFT being connected to one of the plurality of data lines 201, a drain electrode 208 of the TFT being electrically connected to the pixel electrode 205, and a gate electrode 207 of the TFT in each row of pixel units 209 being connected to one of the plurality of gate lines 202;

a plurality of extension sections 204 connected to at least one of the gate lines 202;

wherein the plurality of pixel electrodes 205 are in one-to-one correspondence with the plurality of extension sections 204, and an orthographic projection of each of the plurality of extension sections 204 on the base substrate 200 at least partially overlaps an orthographic projection of a corresponding pixel electrode 205 on the base substrate 200.

For a gate line 202 on the array substrate 01 which connects a plurality of extension sections 204, a plurality of gate electrodes 207 connected to the gate line 202 are located on one side (for example, the upper side shown in FIG. 2) in the length direction of the gate line, and a plurality of extension sections 204 connected to the gate line 202 are located on another side (for example, the lower side shown in FIG. 2) in the length direction of the gate line.

It should be noted that, firstly, the above-mentioned array substrate 01 of course further includes insulating layers isolating different conductive layers, for example, a gate insulation layer isolating the gate electrode 207 of the TFT from the source electrode 206 of the TFT and the drain electrode 208 of the TFT, and the like, Of course, the above-mentioned TFT further includes a structure such as an active layer.

Since embodiments of the present disclosure do not relate to the improvement of the insulating layers of the array substrate and the specific structure of the TFT, the insulating layers and the active layer in the TFT are not shown in FIG. 2, and for their specific structures, the related art can be consulted, which are not defined in the embodiments of the present disclosure.

Secondly, in the above-mentioned array substrate, the naming of the "upper gate line 202" and the "lower gate line 202" is based on the order from top to bottom or from bottom to top in the paper surface of the above-mentioned FIG. 2.

Exemplarily, the gate electrode 207 of the TFT in each row of the above pixel units 209 is connected to a gate line 202 in such a manner that the gate electrode 207 of the TFT in each row of the pixel units 209 is connected to a nearby (or called "adjacent") lower gate line 202.

Exemplarily, the plurality of extension sections 204 connected with at least one gate line 202 are the plurality of extension sections 204 connected with each of the gate lines 202 except the last gate line 202.

Exemplarily, the one-to-one correspondence between the plurality of pixel electrodes 205 and the plurality of extension sections 204 is a one-to-one correspondence between the plurality of pixel electrodes 205 in each row of pixel units 209 and the plurality of extension sections 204 connected to the upper gate line 202 nearby.

Thirdly, it should be understood by those skilled in the art that the overlapping region of the pixel electrode 205 and the extension section 204 constitutes the storage capacitor (Cs). The region where the pixel electrode 205 does not overlap the extension section 204 is used as an aperture region after the above-mentioned array substrate is applied to the display panel, that is to say, the aperture region is a region transmitting backlight for display. Therefore, the area of the extension section 204 is necessarily smaller than the area of the pixel electrode 205.

Furthermore, the orthographic projection of the pixel electrode 205 on the base substrate 200 can completely cover the orthographic projection of the extension section 204 on the base substrate. Or the orthographic projection of the pixel electrode 205 on the base substrate 200 can cover a part of the orthographic projection of the extension section 204 on the base substrate 200. The relationship between them can be flexibly adjusted according to the design requirements of the storage capacity ($C_6$), which is not limited by the embodiments of the present disclosure.

Fourthly, exemplarily, the pixel electrodes 205 in each row of pixel units are in one-to-one correspondence and overlap with the extension sections 204 connected to an upper gate line 202 nearby, and the gate electrode 207 of the TFT in each row of pixel units is connected to a lower gate line 202 nearby.

When the data line is broken, a first pixel unit P1 that fails to receive a data line signal is determined according to the line-broken position, and the pixel electrode in the first pixel unit P1 is made to bypass the line-broken position in order to allow the data line signal to be transmitted continually by bypassing the line-broken position.

For example, the following steps can be performed when the line-broken position is bypassed by using the pixel electrode in the first pixel unit P1:

(i) electrically connecting a front end of the line-broken position to the pixel electrode in the first pixel unit P1 via the extension section in the first pixel unit P1 and a separation section S1' connected with the extension section and electrically separated from the repairing gate line S1; (ii) electrically connecting a back end of the line-broken position to the pixel electrode in the first pixel unit P1 via the gate electrode 207 of the TFT in the first pixel unit P1 that is electrically separated from a lower gate line 202 adjacent to the repairing gate line S1; wherein a direction from the front end to the back end is a transmission direction of the data line signal.

Thus, the separation section S1' electrically separated from the repairing gate line S1 and connected to the extension section in the first pixel unit P1 can be utilized as a repairing connection section, which can be used to repair the broken data line in combination with the pixel electrode, the TFT and the extension section in the first pixel unit P1.

The above-mentioned serial-number (i) and (ii) are only for distinguishing the levels of the description, and do not limit the order of the above-mentioned steps.

When a gate line is broken, a last pixel unit P2 that is capable of receiving a gate line signal and a next pixel unit P3 immediately adjacent to the last pixel unit P2 are determined according to the line-broken position. The line-broken position is bypassed by using the pixel electrode in the last pixel unit P2 and the pixel electrode in the immediately adjacent next pixel unit P3. Thus, the line-broken position is bypassed to make the gate line signal transmitted continually.

For example, the following steps can be performed when the line-broken position is bypassed by using the pixel electrode in the last pixel unit P2 and the pixel electrode in the immediately adjacent next pixel unit P3:

(i) electrically connecting a front end of the line-broken position to the pixel electrode in the last pixel unit P2 via the gate electrode of the TFT in the last pixel unit P2; (ii) electrically connecting a back end of the line-broken position to the pixel electrode in the immediately adjacent next pixel unit P3 via the gate electrode of the TFT in the immediately adjacent next pixel unit P3; (iii) electrically connecting the pixel electrode in the last pixel unit P2 to the pixel electrode in the immediately adjacent next pixel unit P3 via the extension section in the last pixel unit P2, the extension section in the immediately adjacent next pixel unit P3, and a separation section S2' connecting the two extension sections and electrically separated from the repairing gate line S2; wherein a direction from the front end to the back end is a transmission direction of the gate line signal.

Thus, the separation section S2' electrically separated from the repairing gate line S2 and connected to the extension sections in the last pixel unit P2 and the immediately adjacent next pixel unit P3 can be utilized as a repairing connection section, which can be used to repair the broken gate line in combination with the pixel electrodes, the TFTs and the extension sections in the last pixel unit P2 and the immediately adjacent next pixel unit P3.

The above-mentioned serial-number (i), (ii) and (iii) are only for distinguishing the levels of the description, and do not limit the order of the above-mentioned steps.

In the above array substrate provided in some embodiments of the disclosure, the pixel electrodes in each row of pixel units in the array substrate are in one-to-one correspondence and overlap with the extension sections connected to an adjacent upper gate line, and the gate electrode of the TFT is connected to an adjacent lower gate line. Using this ingenious design, the separation section electrically separated from the original gate line in the array substrate can be used as a repairing connection section to effectively repair a broken data line at any position without quantity limitation when a data line on the array substrate is broken. Similarly, the separation section electrically separated from the original gate line in the array substrate can be used as a repairing connection section to effectively repair the broken gate line at any position except the first gate line without quantity limitation when a gate line on the array substrate is broken. Thus, the broken data line and/or the broken gate line are effectively repaired, at the same time, normal signal transmission of the gate line as a repairing line is not affected, and therefore in the above repairing method the pixel unit of other regions away from the line-broken position on the array substrate is minimally affected. The problem that the whole panel is rejected can be avoided by sacrificing merely one or two pixel units, which improves the conformity rate of the display products.

Moreover, since the gate lines used as the repairing lines are uniformly distributed in the whole array substrate, the above repairing method is employed to overcome the problem of signal delay caused by inconsistent signals at both ends of the broken line due to too long transmission path of the electrical signal of the peripheral repairing line when peripheral repairing lines are used, as shown in the exemplary embodiment of the present disclosure, which further improves the display quality.

On this basis, in order to facilitate the cutting of the gate line 202 when it used as a repairing line, referring to FIG. 2, a hollowed-out regions 203 is provided in each of a plurality of intersecting regions formed by spatially intersecting the plurality of gate lines 202 and the plurality of data lines 201 in some embodiments of the present disclosure; wherein the hollowed-out region 203 has a spacing distance with both side edges of the gate lines 202 along its length direction (marked as d1 and d2 respectively in FIG. 2). That is, the width of the hollowed-out region 203 along the direction perpendicular to the length direction of the gate line 202 is smaller than the line width of the gate line 202, and the hollowed-out region 203 is located in the middle of the gate line 202, so that signals can be transmitted normally along the gate line 202 when it is cut as a repairing line.

The spacing distances between the hollowed-out region 203 and the two side edges of the gate line 202 may be the same or different. Considering simplifying the preparation process, the hollowed-out region 203 can be configured to have the same spacing distances with both side edges of the gate line 202, that is, d1=d2.

Values of the above spacing distances d1 and d2 are not defined in the embodiments of the present disclosure, which can be adjusted flexibly according to the line width of the gate line 202 and the width of the hollowed-out region 203.

Besides, the location where the hollowed-out region 203 is located is not limited to the intersecting region of the gate line 202 and the data line 201, and the hollowed-out region 203 can extend from the intersecting region to the both sides (that is, extending from the intersecting region to the left and right in FIG. 2) in the length direction of the gate line 202, so as to facilitate cutting.

Exemplarily, since the above-mentioned repairing method requires fusing the pixel electrode and the extension section on the gate line (fusing is performed at a region where they overlaps, and the overlapping region constitutes a storage capacitor), the plurality of gate lines 202 are disposed closer to the base substrate 200 than the plurality of data lines 201 so as to facilitate the fusion process (for example, using laser fusing) in some embodiments of the present disclosure. That is, the plurality of gate lines 202 are located below the plurality of data lines 201 relative to the base substrate 200. This is because that the fusion process is performed on a side of the base substrate 200.

Based on the above array substrate, some embodiments of the present disclosure also provide a method for repairing broken lines of the array substrate, which is capable of repairing broken data lines and broken gate lines on the array substrate.

Figure 3:
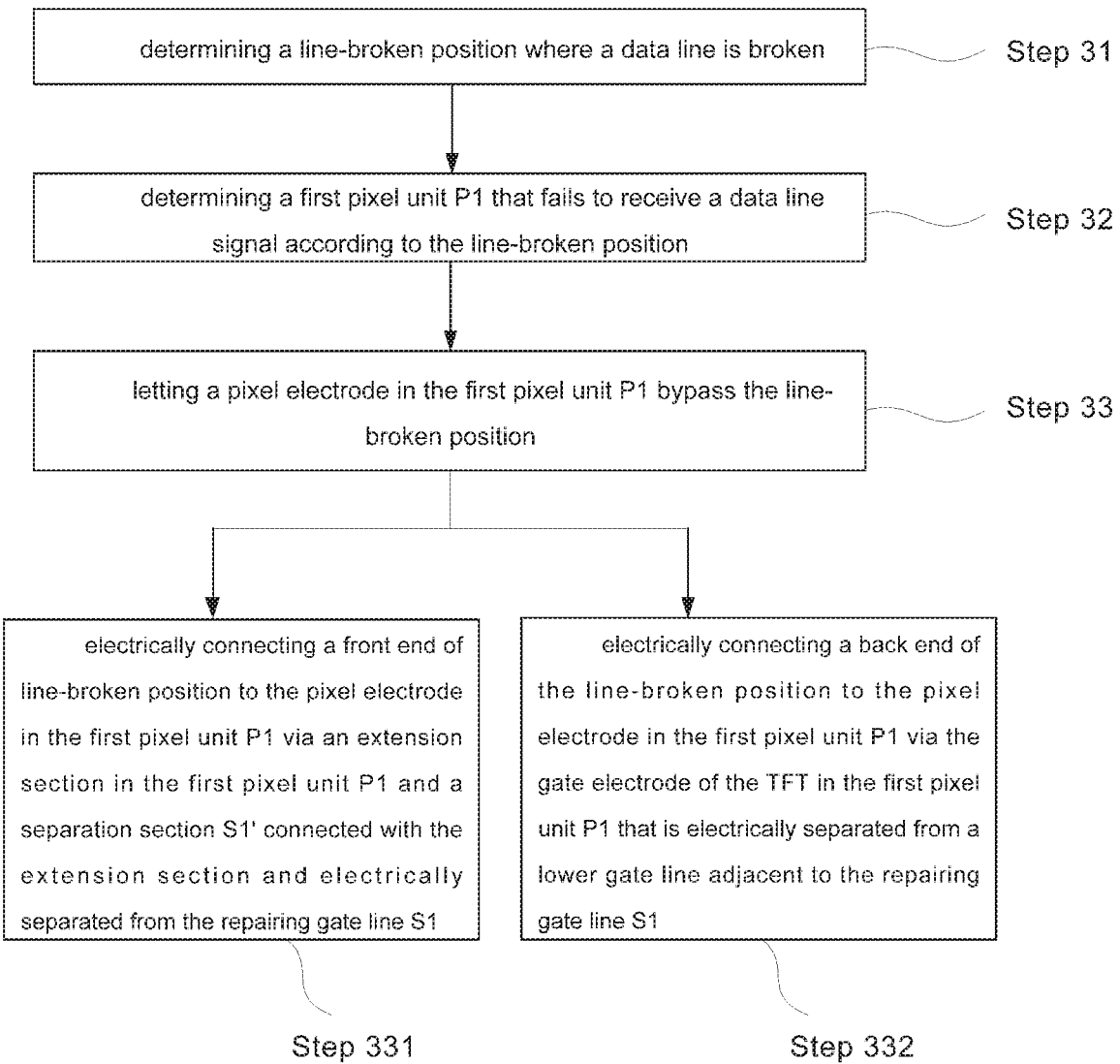
FIG. 3 is a flow chart of a method for repairing broken lines of an array substrate provided in some embodiments of the present disclosure.

As shown in FIG. 3, some embodiments of the present disclosure provide a method for repairing broken lines of the array substrate 01 to repair broken data lines on the array substrate. The array substrate 01 can be an array substrate in a display panel formed by ceiling the array substrate together with the color filter substrate (or, the array substrate together with the cover plate).

The method for repairing broken lines includes steps 31~33 (it should be noted that the following numbering of each step is not intended to limit the sequence of the steps, but to facilitate description).

Step 31, determining a line-broken position where a data line is broken;

Step 32, determining a first pixel unit P1 that fails to receive a data line signal according to the line-broken position;

Step 33, letting the pixel electrode in the first pixel unit P1 bypass the line-broken position, comprising steps 331 and 332:

Step 331, electrically connecting a front end of the line-broken position to the pixel electrode in the first pixel unit P1 via the extension section in the first pixel unit P1 and a separation section S1' connected with the extension section and electrically separated from the repairing gate line S1;

Step 332, electrically connecting a back end of the line-broken position to the pixel electrode in the first pixel unit P1 via the gate electrode of the TFT in the first pixel unit P1 that is electrically separated from a lower gate line adjacent to the repairing gate line S1;

wherein a direction from the front end to the back end is a transmission direction of the data line signal.

It can be understood that the above steps 331 and 332 are not limited in sequence. Steps 331 and 332 can be performed sequentially or simultaneously, which is not limited in the embodiments of the present disclosure.

Figure 4:
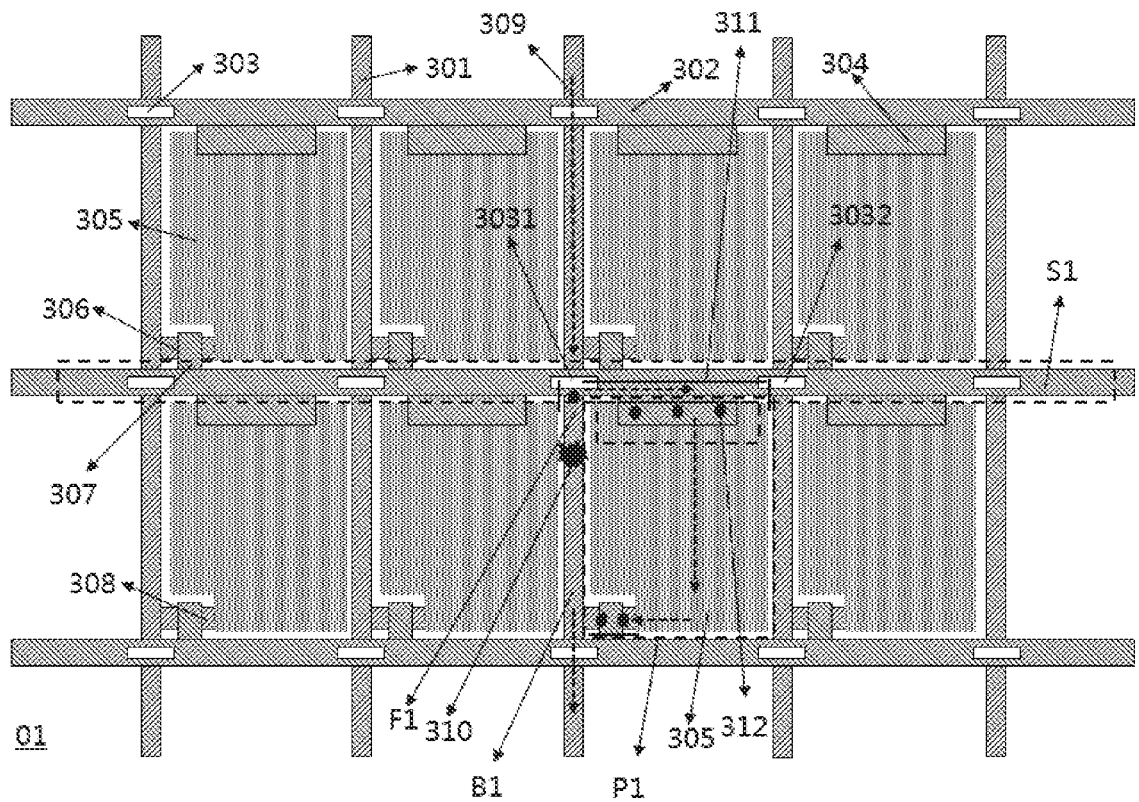
FIG. 4 is a diagram of repairing principle of an array substrate which is seen from a side of a base substrate provided in some embodiments of the present disclosure.
Figure 5:
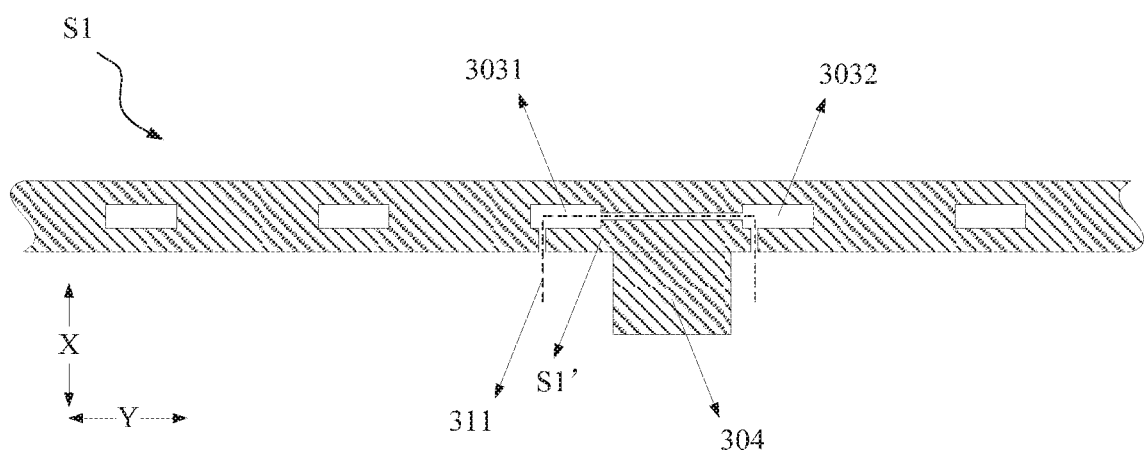
FIG. 5 is a magnified schematic diagram illustrating a partial structure indicated by the dotted line in FIG. 4 after cutting a repairing gate line S1.

Exemplarily, FIG. 4 and FIG. 5 show the repair process of the broken data line, including steps 41~43:

Step 41, determining a line-broken position 310 of a data line when one of the plurality of data lines 301 in the array substrate is broken;

Exemplarily, the line-broken position 310 can be determined through manual inspection or by means of an inspection device.

Step 42, determining a first pixel unit P1 that fails to receive a data line signal according to the line-broken position 310.

Step 43, letting the pixel electrode 305 in the first pixel unit P1 bypass the line-broken position 310, comprising steps 431 and 432:

Step 431, electrically connecting a front end F1 of the line-broken position 310 to the pixel electrode 305 in the first pixel unit P1 via the extension section 304 in the first pixel unit P1 and a separation section S1' connected with the extension section 304 and electrically separated from the repairing gate line S1;

Step 432, electrically connecting a back end B1 of the line-broken position 310 to the pixel electrode 305 in the first pixel unit P1 via the gate electrode 307 of the TFT in the first pixel unit P1 that is electrically separated from a lower gate line 302 adjacent to the repairing gate line S1;

wherein a direction from the front end F1 to the back end B1 is a transmission direction of the data line signal (as indicated by the arrow on the data line 301 in FIG. 4).

It can be understood that the above-mentioned steps 431 and 432 are not limited in sequence. Steps 431 and 432 can be performed sequentially or simultaneously, which is not limited in the embodiments of the present disclosure.

Exemplarily, the above-mentioned step 431 includes steps 431a~431c:

Step 431a, cutting the repairing gate line S1 in a region adjacent to the first pixel unit P1 to form the separation section S1' electrically separated from the repairing gate line S1 (only a limited area of the repairing gate line S1 is shown in FIG. 4, and the separation section S1' is difficult to be shown, so the separation section S1' is only shown in FIG. 5), and the separation section S1' being connected to the extension section 304 in the first pixel unit P1;

Step 431b, fusing the separation section S1' with the front end F1 of the line-broken position 310;

Step 431c, fusing the extension section 304 in the first pixel unit P1 with the pixel electrode 305 in the first pixel unit P1.

It should be noted that in the above-mentioned steps 431a, 431b and 431c, the fusion processes and the cutting process are not limited in sequence. Steps 431a, 431b and 431c can be performed sequentially or simultaneously, which is not limited in the embodiments of the present disclosure.

Exemplarily, in the above-mentioned fusion processes, laser fusing is adopted, so that the fused portions are directly connected with each other by penetrating the insulating medium therebetween, so as to achieve electrical connection.

The welding points of the laser fusing 312 include, but are not limited to, the numbers shown in FIG. 4, and it is available as long as the two conductive structures fused together are sufficiently fused to achieve electrical connection.

Exemplarily, in the above-mentioned cutting process, laser cutting is adopted. The direction of the laser cutting 311 and the position of the laser fusing 312 are shown in FIG. 4.

Exemplarily, to facilitate the operation of the fusing process, the above-mentioned step 431b includes:

Fusing the separation section S1' with the front end F1 of the line-broken position 310 at a region where the repairing gate line S1 intersects with the broken data line.

Exemplarily, to facilitate the cutting process, each of the plurality of gate lines 302 has a hollowed-out region 303 on an intersecting region with the plurality of data lines 301; the hollowed-out region 303 has spacing distances with both side edges of the gate lines 302 along its length direction.

In this way, it is convenient to determine that the hollowed-out region 303 located at a region where the repairing gate line S1 intersects with the broken data line 301 is a first hollowed-out region 3031, and a next hollowed-out region 303 along the length direction of the repairing gate line S1 and immediately adjacent to the first hollowed-out region 3031 is a second hollowed-out region 3032.

Afterwards, cutting the repairing gate line S1 in a region adjacent to the first pixel unit P1, and the cutting path passes through the first hollowed-out region 3031 and the second hollowed-out region 3032, and a separation section S1' electrically separated from the repairing gate line S1 is formed by means of the first hollowed-out region 3031 and the second hollowed-out region 3032.

That is, referring to FIG. 5, the first hollowed-out region 3031 and the second hollowed-out region 3032 are used as cutting marks to cut the repairing gate line S1 along a width direction (symbolized as X in FIG. 5), a length direction (symbolized as Y in FIG. 5), and a width direction (symbolized as X in FIG. 5) respectively, thereby forming a separation section S1' electrically separated from the repairing gate line S1 as shown in FIG. 5.

The length direction Y here is an extension direction of the repairing gate line S1, the width direction X is a direction perpendicular to the length direction Y in a plane where the repairing gate line S1 is located.

Exemplarily, the above step 432 includes steps 432a-432c;

Step S432a, cutting the gate electrode 307 of the TFT in the first pixel unit P1 to electrically separate the cut gate electrode 307 from a gate line 302 corresponding to the first pixel unit P1;

Step S432b, fusing the gate electrode 307 of the TFT in the first pixel unit P1 with the source electrode 306 thereof, wherein the source electrode 306 is electrically connected to the back end B1 of the line-broken position 310;

Step S432c, fusing the gate electrode 307 of the TFT in the first pixel unit P1 with the drain electrode 308 thereof, wherein the drain electrode 308 is electrically connected to the pixel electrode 305 in the first pixel unit P1.

It should be noted that in the above steps 432a, 432b and 432c, the fusion processes and the cutting process are not limited in sequence. Steps 432a, 432b and 432c can be performed sequentially or simultaneously, which is not limited in the embodiments of the present disclosure.

Exemplarily, in the above-mentioned fusion processes, laser fusing is adopted, so that the fused portions are directly connected with each other by penetrating the insulating medium therebetween, so as to achieve electrical connection.

It can be understood that in a direction perpendicular to a board surface of the base substrate 200, the source electrode 306 of the TFT has an overlapping region with the gate electrode 307 of the TFT, and the drain electrode 308 of the TFT also has an overlapping region with the gate electrode 307 of the TFT, which facilitates the fusion processes.

Thus, both ends (i.e., the front end F1 and the back end B1) of the line-broken position along the length direction of the data line 301 are electrically connected through the following structure:

a fused portion where the broken data line 301 is fused with the separation section S1', a fused portion where the extension section 304 connected to the separation section S1' is fused with the pixel electrode 305 in the first pixel unit P1, a fused portion where the source electrode 306 of the TFT in the first pixel unit P1 is fused with the gate electrode 307 of the same TFT, and a fused portion where the drain electrode 308 of the TFT in the first pixel unit P1 is fused with the gate electrode 307 of the same TFT.

The signal transmission direction 309 in the repaired data line 301 which is broken is shown by the dotted arrow in FIG. 4.

Thus, only the first pixel unit P1 that fails to receive a data line signal of the broken data line 301 before the repair is sacrificed (that is, the first pixel unit P1 is no longer used for displaying, but the pixel electrode 305 in the first pixel unit P1 is used as a conductive structure to bypass the line-broken position), when the display panel is repaired by using the above method in the case that one or several data lines 301 are broken. That is, the entire data line 301 can be repaired on the base that this pixel unit P1 cannot be normally displayed. This avoids the problem that the entire panel is rejected, which significantly improves the conformity rate of the display products.

Figure 6:
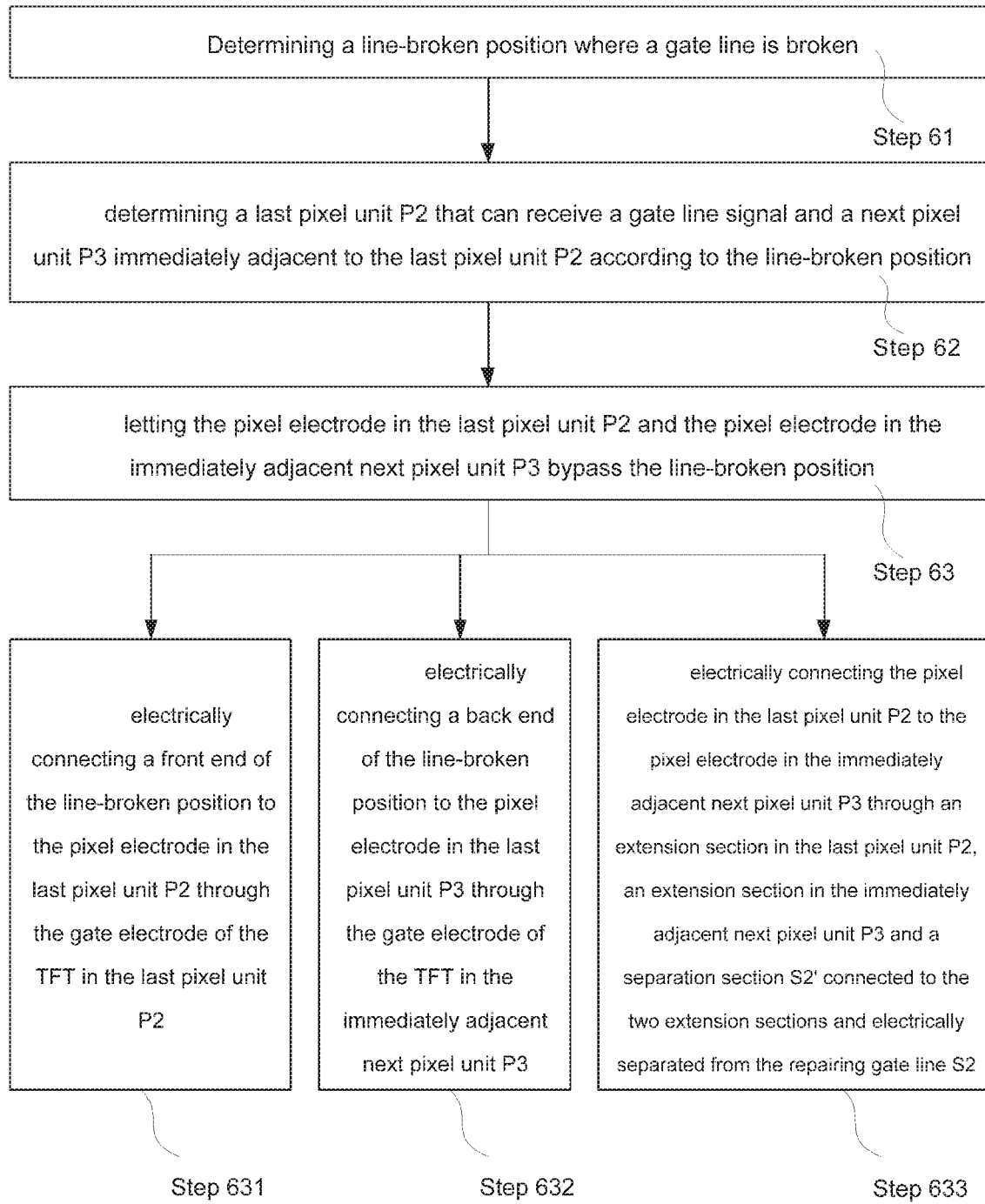
FIG. 6 is a flow chart of another method for repairing broken lines of an array substrate provided in some embodiments of the present disclosure.

As shown in FIG. 6, some embodiments of the present disclosure provide a method for repairing broken lines of the above-mentioned array substrate 01 to repair broken gate lines on the array substrate. The array substrate 01 can be an array substrate in a display panel formed by ceiling the array substrate together with the color filter substrate (or, the array substrate together with the cover plate).

The method for repairing broken lines includes steps 61~63 (it should be noted that the following numbering of each step is not intended to limit the sequence of the steps, but to facilitate the description).

Step 61, determining a line-broken position where a gate line is broken;

step 62, determining a last pixel unit P2 that is capable of receiving the gate line signal and a next pixel unit P3 immediately adjacent to the last pixel unit P2 according to the line-broken position;

Step 63, letting the pixel electrode in the last pixel unit P2 and the pixel electrode in the immediately adjacent next pixel unit P3 bypass the line-broken position, comprising steps 631~633:

Step 631, electrically connecting a front end of the line-broken position to the pixel electrode in the last pixel unit P2 through the gate electrode of the TFT in the last pixel unit P2;

Step 632, electrically connecting a back end of the line-broken position to the pixel electrode in the immediately adjacent next pixel unit P3 through the gate electrode of the TFT in the immediately adjacent next pixel unit P3;

Step 633, electrically connecting the pixel electrode in the last pixel unit P2 to the pixel electrode in the immediately adjacent next pixel unit P3 through an extension section in the last pixel unit P2, an extension section in the immediately adjacent next pixel unit P3 and a separation section S2' connected to the two extension sections and electrically separated from the repairing gate line S2.

A direction from the front end to the back end is a transmission direction of the gate line signal.

It can be understood that the above-mentioned steps 631, 632 and 633 are not limited in sequence. Steps 631, 632 and 633 can be performed sequentially or simultaneously, which is not limited in the embodiments of the present disclosure.

Figure 7:
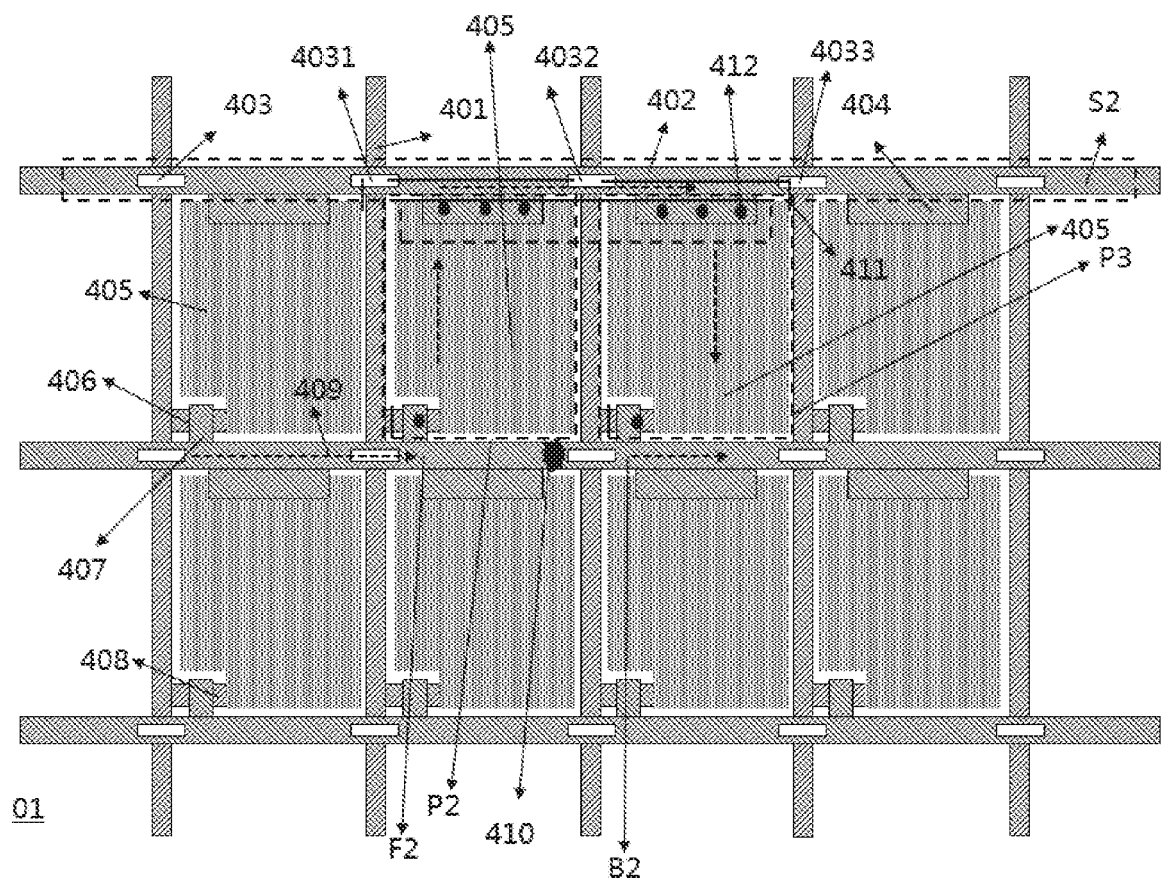
FIG. 7 is a diagram of another repairing principle of an array substrate which is seen from a side of a base substrate provided in some embodiments of the present disclosure.
Figure 8:
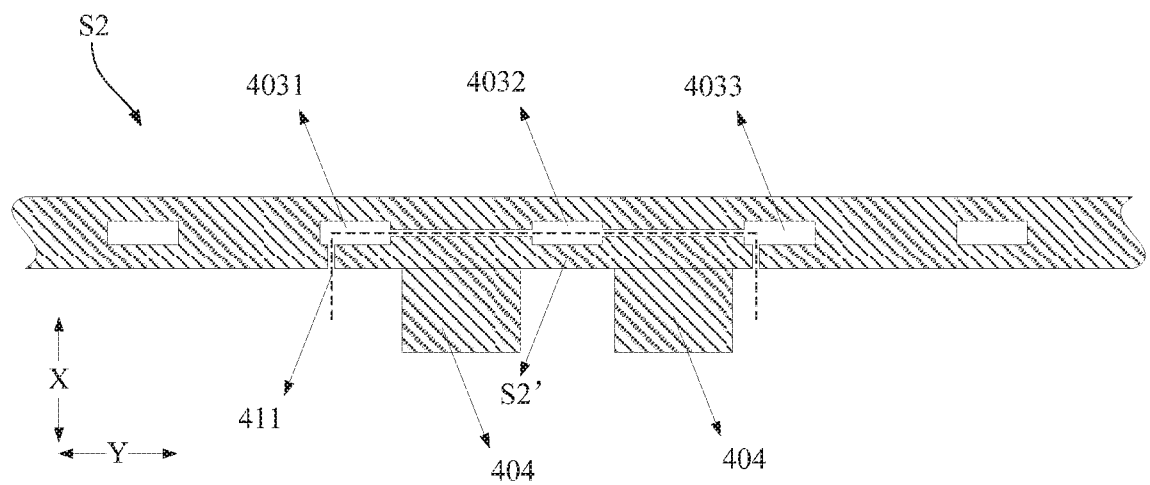
FIG. 8 is a magnified schematic diagram illustrating a partial structure indicated by the dotted line in FIG. 7 after cutting a repairing gate line S2.

Exemplarily, FIG. 7 and FIG. 8 show the repair process of the broken gate line, including steps 71~73:

Step 71, determining a line-broken position 410 of the gate line 302 when one of the plurality of gate lines 302 in the array substrate is broken;

Exemplarily, the line-broken position 410 can be determined through manual inspection or by means of an inspection device.

Step 72, determining a last pixel unit P2 that is capable of receiving a gate line signal and a next pixel unit P3 immediately adjacent to the last pixel unit P2 according to the line-broken position 410;

Step 73, letting the pixel electrode 405 in the last pixel unit P2 and the pixel electrode 405 in the immediately adjacent next pixel unit P3 bypass the line-broken position 410, comprising steps 731~733:

Step 731, electrically connecting a front end (F2) of the line-broken position 410 to the pixel electrode 405 in the last pixel unit P2 through the gate electrode of the TFT in the last pixel unit P2;

Step 732, electrically connecting a back end (B2) of the line-broken position 410 to the pixel electrode 405 in the immediately adjacent next pixel unit P3 through the gate electrode of the TFT in the immediately adjacent next pixel unit P3;

Step 733, electrically connecting the pixel electrode 405 in the last pixel unit P2 to the pixel electrode 405 in the immediately adjacent next pixel unit P3 through an extension section 404 in the last pixel unit P2, an extension section 404 in the immediately adjacent next pixel unit P3, and a separation section S2' connected to the two extension sections 404 and electrically separated from the repairing gate line S2.

A direction from the front end (F2) to the back end (b2) is a transmission direction of the gate line signal (as indicated by the arrow on the gate line 402 in FIG. 6).

It can be understood that the above-mentioned steps 731, 732 and 733 are not limited in sequence. Steps 731, 732 and 733 can be performed sequentially or simultaneously, which is not limited in the embodiments of the present disclosure.

Exemplarily, the above-mentioned step 731 includes steps 731a and 731b:

Step 731a, cutting the source electrode 406 of the TFT in the last pixel unit P2 to electrically separate the cut source electrode 406 from a data line 401 corresponding to the last pixel unit P2;

Step 731b, fusing the gate electrode 407 of the TFT in the last pixel unit P2 with the drain electrode 408, wherein the gate electrode 407 in the last pixel unit P2 is electrically connected to the front end F2 of the line-broken position 410, and the drain electrode 408 in the last pixel unit P2 is electrically connected to the pixel electrode 405 in the last pixel unit P2;

Exemplarily, the above-mentioned step 732 includes steps 732a and 732b:

Step 732a, cutting the source electrode 406 of the TFT in the immediately adjacent next pixel unit P3 to electrically separate the cut source electrode 406 from a data line 401 corresponding to the immediately adjacent next pixel unit P3;

Step 732b, fusing the gate electrode 407 of the TFT in the immediately adjacent next pixel unit P3 with the drain electrode 408, wherein the gate electrode 407 in the immediately adjacent next pixel unit P3 is electrically connected to the back end B2 of the line-broken position 410, and the drain electrode 408 in the immediately adjacent next pixel unit P3 is electrically connected to the pixel electrode 405 in the immediately adjacent next pixel unit P3.

It can be understood that the above-mentioned steps 731a, 731b and 732a, 732b are not limited in sequence. Steps 731a, 731b and 732a, 732b can be performed sequentially or simultaneously, which is not limited in the embodiments of the present disclosure.

Exemplarily, in the above-mentioned fusion processes, laser fusing (or called as fusion) is adopted, so that the fused portions are directly connected with each other by penetrating the insulating medium therebetween, so as to achieve electrical connection.

In a direction perpendicular to a board surface of the base substrate, the drain electrode 408 of the TFT has an overlapping region with the gate electrode 407 of the TFT to facilitate the fusion processes.

Exemplarily, in the above-mentioned cutting process, laser cutting is adopted. The direction of the laser cutting 411 and the position of the laser fusing 412 are shown in FIG. 7.

The welding points of the laser fusing 412 include, but are not limited to, the numbers shown in FIG. 7, and it is available as long as the two conductive structures fused together are sufficiently fused to achieve electrical connection.

Exemplarily, the above-mentioned step 733 includes steps 733a~733c:

Step 733a, cutting the repairing gate line S2 in a region adjacent to the last pixel unit P2 and the immediately adjacent next pixel unit P3 to form the separation section S2' electrically separated from the repairing gate line S2 (only a limited area of the repairing gate line S2 is shown in FIG. 7, and the separation section S2' is difficult to be shown, so the separation section S2' is only shown in FIG. 8), and the separation section S2' being connected to both extension sections 404 in the last pixel unit P2 and the immediately adjacent next pixel unit P3;

Step 733b, fusing the extension section 404 in the last pixel unit P2 with the pixel electrode 405 in the last pixel unit P2;

Step 733c, fusing the extension section 404 in the immediately adjacent next pixel unit P3 with the pixel electrode 405 in the immediately adjacent next pixel unit P3.

It can be understood that the above-mentioned steps 733a, 733b and 733c are not limited in sequence. Steps 733a, 733b and 733c can be performed sequentially or simultaneously, which is not limited in the embodiments of the present disclosure.

Exemplarily, to facilitate the cutting process, each of the plurality of gate lines 402 has a hollowed-out region 403 on an intersecting region with the plurality of data lines 401; the hollowed-out region 403 has spacing distances with both side edges of the gate line 402 along its length direction.

In this way, it is convenient to determine that the hollowed-out region 403 located at a region where the repairing gate line S2 intersects with the data line 401 corresponding to the last pixel unit P2 is a third hollowed-out region 4031, and next two hollowed-out regions along the length direction of the repairing gate line S2 that are adjacent to the third hollowed-out region 4031 are sequentially a fourth hollowed-out region 4032 and a fifth hollowed-out region 4033;

Afterwards, cutting the repairing gate line S2 in a region adjacent to the last pixel unit P2 and the immediately adjacent next pixel unit P3, and the cutting path passes through the third hollowed-out region 4031, the fourth hollowed-out region 4032 and the fifth hollowed-out region 4033, and a separation section S2' electrically separated from the repairing gate line S2 is formed by virtue of the third hollowed-out region 4031, the fourth hollowed-out region 4032 and the fifth hollowed-out region 4033.

That is, referring to FIG. 8, the third hollowed-out region 4031, the fourth hollowed-out region 4032 and the fifth hollowed-out region 4033 are used as cutting marks to cut the repairing gate line S2 along a width direction (symbolized as X in FIG. 8), a length direction (symbolized as Y in FIG. 8), and a width direction (symbolized as X in FIG. 8) respectively, thereby forming a separation section S2' electrically separated from the repairing gate line S2 as shown in FIG. 8.

The length direction Y here is an extension direction of the repairing gate line S2, the width direction X is a direction perpendicular to the length direction Y in a plane where the repairing gate line S2 is located.

Thus, the two ends (i.e., the front end F2 and the back end B2) of the line-broken position along the length direction of the gate line 402 are electrically connected through the following structure:

fused portions where drain electrodes 408 of the respective TFTs in the last pixel unit P2 and in the immediately adjacent next pixel unit P3 are fused with their corresponding gate electrodes 407, fused portions where the respective pixel electrodes 405 in the last pixel unit P2 and in the immediately adjacent pixel unit P3 are fused with their corresponding extension sections 404 in the overlapping regions along a direction perpendicular to the board surface of the base substrate 200, and the separation section S2' connected with the two extension sections 404.

The signal transmission direction 409 in the repaired gate line 402 which is broken is shown by the dotted arrow in FIG. 7.

Thus, only the last pixel unit P2 that receives a gate line signal of the broken gate line 402 and the immediately adjacent next pixel unit P3 in the length direction of the gate line 402 before the repair are sacrificed (that is, the last pixel unit P2 and the immediately adjacent next pixel unit P3 are no longer used for displaying, but the respective pixel electrodes 405 in the last pixel unit P2 and the immediately adjacent next pixel unit P3 are used as conductive structures to bypass the line-broken position), when the display panel is repaired by using the above method in the case that one or several gate lines 402 are broken. That is, the entire gate line 402 can be repaired on the base that the two pixel units cannot be normally displayed. This avoids the problem that the entire panel is rejected, which significantly improves the conformity rate of the display products.

Figure 9:
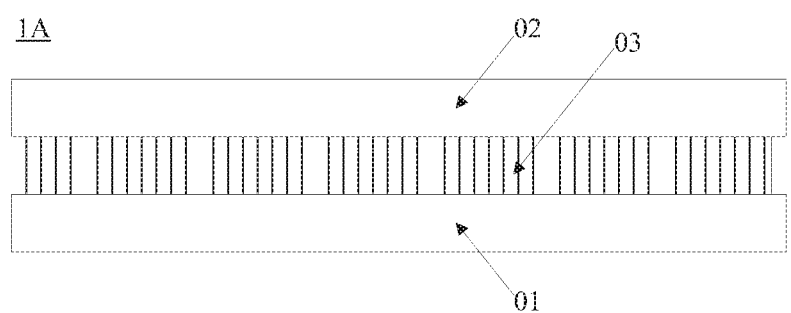
FIG. 9 is a structural diagram of a display device provided in some embodiments of the present disclosure.

As shown in FIG. 9, some embodiments of the present disclosure further provide a display device 1A, including the above-mentioned array substrate 01, or an array substrate 01 repaired in the above-mentioned method for repairing broken lines.

The display device 1A further includes an opposite substrate 02 which is celled with the array substrate 01, and a liquid crystal layer 03 located between the array substrate 01 and the opposite substrate 02.

Exemplarily, the opposite substrate can be a color filter substrate; or, the opposite substrate can be a cover glass when the array substrate 01 is a color filter on array (COA) array substrate, that is, when a color filter film is formed on the array substrate.

The above-mentioned display device can be a liquid crystal display device, or a product or a component having any display function, such as a liquid crystal display, a liquid crystal television, a digital photo frame, a mobile phone, a tablet computer, and a navigator.

The foregoing descriptions are merely specific embodiments of the present disclosure, but the protection scope of the present disclosure is not limited thereto. Any variation or replacement readily conceivable to those skilled in the art in the technical scope disclosed by the present disclosure shall fall in the protection scope of the present disclosure. Therefore, the protection scope of the present disclosure shall be determined by the protection scope of the claims.

What is claimed is:

1. An array substrate, comprising:
a base substrate;
a plurality of gate lines and a plurality of data lines located on the base substrate, the plurality of gate lines intersecting with the plurality of data lines to define a plurality of pixel units arranged in an array; each row of pixel units being located between two adjacent gate lines;
a hollowed-out region is provided in an intersecting region formed by intersecting each of the plurality of gate lines with each of the plurality of data lines; the hollowed-out region has spacing distances with both side edges of the gate line along its length direction;
a thin film transistor and a pixel electrode located in each pixel unit; a source electrode of the thin film transistor being connected to one of the plurality of data lines, and a drain electrode of the thin film transistor being electrically connected to the pixel electrode; a gate electrode of the thin film transistor in each row of the pixel units being connected to one of the plurality of gate lines;
a plurality of extension sections connected with at least one gate line;
wherein a plurality of pixel electrodes are in one-to-one correspondence with the plurality of extension sections, and an orthographic projection of each of the plurality of extension sections on the base substrate at least partially overlaps an orthographic projection of a corresponding pixel electrode on the base substrate.

2. The array substrate according to claim 1, wherein the plurality of gate lines are disposed closer to the base substrate than the plurality of data lines.

3. A method for repairing broken lines of the array substrate according to claim 1, comprising:
determining a line-broken position where a data line is broken;
determining a first pixel unit that fails to receive a data line signal according to the line-broken position;
letting a pixel electrode in the first pixel unit bypass the line-broken position, comprising:
electrically connecting a front end of the line-broken position to the pixel electrode in the first pixel unit via an extension section in the first pixel unit and a separation section connected with the extension section and electrically separated from a repairing gate line;
electrically connecting a back end of the line-broken position to the pixel electrode in the first pixel unit via the gate electrode of the thin film transistor in the first pixel unit that is electrically separated from a lower gate line adjacent to the repairing gate line;
wherein a direction from the front end to the back end is a transmission direction of the data line signal.

4. The method for repairing broken lines of the array substrate according to claim 3, wherein electrically connecting the front end of the line-broken position to the pixel electrode in the first pixel unit comprises:
cutting the repairing gate line in a region adjacent to the first pixel unit to form a separation section electrically separated from the repairing gate line, the separation section being connected to the extension section in the first pixel unit;
fusing the separation section with the front end of the line-broken position;
fusing the extension section in the first pixel unit with the pixel electrode in the first pixel unit.

5. The method for repairing broken lines of the array substrate according to claim 3, wherein electrically connecting the back end of the line-broken position to the pixel electrode of the first pixel unit comprises:
cutting the gate electrode of a thin film transistor in the first pixel unit to electrically separate the cut gate electrode from a gate line corresponding to the first pixel unit;
fusing the gate electrode of the thin film transistor in the first pixel unit with the source electrode thereof, wherein the source electrode is electrically connected to the back end of the line-broken position;
fusing the gate electrode of the thin film transistor in the first pixel unit with the drain electrode thereof, wherein the drain electrode is electrically connected to the pixel electrode in the first pixel unit.

6. The method for repairing broken lines according to claim 4, wherein the fusing the separation section with the front end of the line-broken position comprises:
fusing the separation section with the front end of the line-broken position at a region where the repairing gate line intersects with the broken data line.

7. The method for repairing broken lines according to claim 4, wherein a hollowed-out region is provided in an intersecting region formed by intersecting each of the plurality of gate lines with each of the plurality of data lines; the hollowed-out region has spacing distances with both side edges of the gate line along its length direction;

determining that a hollowed-out region at a region where the repairing gate line intersects with the broken data line is a first hollowed-out region, and a next hollowed-out region along the length direction of the repairing gate line and immediately adjacent to the first hollowed-out region is a second hollowed-out region;

cutting the repairing gate line in a region adjacent to the first pixel unit, and the cutting path passing through the first hollowed-out region and the second hollowed-out region, and forming a separation section electrically separated from the repairing gate line by virtue of the first hollowed-out region and the second hollowed-out region.

8. The method for repairing broken lines according to claim 7, wherein cutting the repairing gate line in a region adjacent to the first pixel unit comprises:

cutting the repairing gate line in a width direction, a length direction, and then a width direction sequentially.

9. The method for repairing broken lines according to claim 4, wherein the cutting is a cutting using a laser; and/or, the fusing is a fusing using a laser.

10. The method for repairing broken lines according to claim 5, wherein the cutting is a cutting using a laser; and/or, the fusing is a fusing using a laser.

11. A method for repairing broken lines of the array substrate according to claim 1, comprising:

determining a line-broken position where a gate line is broken;

determining a last pixel unit that can receive a gate line signal and a next pixel unit immediately adjacent to the last pixel unit according to the line-broken position;

letting a pixel electrode in the last pixel unit and a pixel electrode in an immediately adjacent next pixel unit bypass the line-broken position, comprising:

electrically connecting a front end of the line-broken position to the pixel electrode in the last pixel unit via the gate electrode of the thin film transistor in the last pixel unit;

electrically connecting a back end of the line-broken position to the pixel electrode in the immediately adjacent next pixel unit via the gate electrode of the thin film transistor in the immediately adjacent next pixel unit;

electrically connecting the pixel electrode in the last pixel unit to the pixel electrode in the immediately adjacent next pixel unit via an extension section in the last pixel unit, an extension section in the immediately adjacent next pixel unit, and a separation section connecting the two extension sections and electrically separated from the repairing gate line;

wherein a direction from the front end to the back end is a transmission direction of the gate line signal.

12. The method for repairing broken lines of the array substrate according to claim 11, wherein electrically connecting a front end of the line-broken position to the pixel electrode in the last pixel unit comprises:

cutting the source electrode of the thin film transistor in the last pixel unit to electrically separate the cut source electrode from a data line corresponding to the last pixel unit;

fusing the gate electrode of the thin film transistor in the last pixel unit with the drain electrode thereof, wherein the gate electrode is electrically connected to the front end of the line-broken position, and the drain electrode is electrically connected to the pixel electrode in the last pixel unit;

electrically connecting a back end of the line-broken position to the pixel electrode in the immediately adjacent next pixel unit comprises:

cutting the source electrode of the thin film transistor in the immediately adjacent next pixel unit to electrically separate the cut source electrode from a data line corresponding to the immediately adjacent next pixel unit;

fusing the gate electrode of the thin film transistor in the immediately adjacent next pixel unit with the drain electrode thereof, wherein the gate electrode is electrically connected to the back end of the line-broken position, and the drain electrode is electrically connected to the pixel electrode in the immediately adjacent next pixel unit.

13. The method for repairing broken lines of the array substrate according to claim 11, wherein electrically connecting the pixel electrode in the last pixel unit to the pixel electrode in the immediately adjacent next pixel unit comprises:

cutting the repairing gate line in a region adjacent to the last pixel unit and the immediately adjacent next pixel unit to form a separation section electrically separated from the repairing gate line, and the separation section being connected to extension sections in the last pixel unit and the immediately adjacent next pixel unit;

fusing the extension section in the last pixel unit with the pixel electrode in the last pixel unit;

fusing the extension section in the immediately adjacent next pixel unit with the pixel electrode in the immediately adjacent next pixel unit.

14. The method for repairing broken lines according to claim 13, wherein a hollowed-out region is provided in an intersecting region formed by intersecting each of the plurality of gate lines with each of the plurality of data lines; the hollowed-out region has spacing distances with both side edges of the gate line along its length direction;

determining that a hollowed-out region at a region where the repairing gate line intersects with the data line corresponding to the last pixel unit is a third hollowed-out region, and next two hollowed-out regions along the length direction of the repairing gate line and immediately adjacent to the third hollowed-out region are sequentially a fourth hollowed-out region and a fifth hollowed-out region;

cutting the repairing gate line in a region adjacent to the last pixel unit and the immediately adjacent next pixel unit, and the cutting path passing through the third hollowed-out region, the fourth hollowed-out region and the fifth hollowed-out region, and forming a separation section electrically separated from the repairing gate line by virtue of the third hollowed-out region, the fourth hollowed-out region and the fifth hollowed-out region.

15. The method for repairing broken lines according to claim 14, wherein the cutting the repairing gate line in a region adjacent to the last pixel unit and the immediately adjacent next pixel unit comprises:

cutting the repairing gate line in a width direction, a length direction, and then a width direction sequentially.

16. The method for repairing broken lines according to claim 12, wherein the cutting is a cutting using a laser; and/or, the fusing is a fusing using a laser.

17. The method for repairing broken lines according to claim 13, wherein the cutting is a cutting using a laser; and/or, the fusing is a fusing using a laser.

18. A display device, comprising the array substrate according to claim 1, an opposite substrate which is celled with the array substrate, and a liquid crystal layer located between the array substrate and the opposite substrate.

* * * * *